United States Patent
Peng et al.

(10) Patent No.: US 8,219,870 B2
(45) Date of Patent: Jul. 10, 2012

(54) EQUIPMENT AND A METHOD FOR BIT COLLECTION IN HYBRID AUTOMATIC REPETITION REQUEST

(75) Inventors: Focai Peng, Shenzhen (CN); Cuihong Han, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 523 days.

(21) Appl. No.: 12/521,960

(22) PCT Filed: Dec. 28, 2007

(86) PCT No.: PCT/CN2007/003869
§ 371 (c)(1),
(2), (4) Date: Jul. 1, 2009

(87) PCT Pub. No.: WO2008/086710
PCT Pub. Date: Jul. 24, 2008

(65) Prior Publication Data
US 2010/0115361 A1    May 6, 2010

(30) Foreign Application Priority Data
Jan. 5, 2007   (CN) .......................... 2007 1 0000128

(51) Int. Cl.
*H04L 1/18* (2006.01)
*H03M 13/00* (2006.01)

(52) U.S. Cl. ...................... 714/748; 714/755

(58) Field of Classification Search .............. 714/748, 714/755; 375/265
See application file for complete search history.

(56) References Cited

U.S. PATENT DOCUMENTS

| | | | | |
|---|---|---|---|---|
| 6,973,611 B2 * | 12/2005 | Dabak et al. | | 714/755 |
| 7,000,173 B2 * | 2/2006 | Buckley et al. | | 714/790 |
| 7,027,782 B2 * | 4/2006 | Moon et al. | | 455/102 |
| 7,028,230 B2 * | 4/2006 | Manninen et al. | | 714/702 |
| 7,146,552 B2 * | 12/2006 | Kim et al. | | 714/755 |
| 7,210,089 B2 * | 4/2007 | Xu et al. | | 714/751 |
| 7,263,088 B2 * | 8/2007 | Bui | | 370/338 |
| 7,269,776 B2 * | 9/2007 | Park et al. | | 714/752 |
| 7,509,555 B2 * | 3/2009 | Ishizaki | | 714/748 |
| 7,613,243 B2 * | 11/2009 | Ouyang et al. | | 375/260 |
| 7,668,188 B2 * | 2/2010 | Chang et al. | | 370/415 |
| 7,685,495 B2 * | 3/2010 | Bhushan | | 714/755 |
| 7,710,926 B2 * | 5/2010 | Beale | | 370/335 |
| 7,764,743 B2 * | 7/2010 | Farag | | 375/265 |
| 7,860,186 B2 * | 12/2010 | Yano et al. | | 375/298 |
| 8,077,789 B2 * | 12/2011 | Wengerter et al. | | 375/265 |
| 2005/0166119 A1 | 7/2005 | Park et al. | | |
| 2009/0161742 A1 * | 6/2009 | Ivory et al. | | 375/225 |

FOREIGN PATENT DOCUMENTS

CN    101106440 A    1/2008

OTHER PUBLICATIONS

3GPP TS 25.212 V7.3.0 3rd Generation Partnership Project; Technical Specification Group Radio Access Network; Multiplexing and channel coding (FDD) (Release 7). Dec. 2006.
PCT/CN2007/003869 International Search Report.

* cited by examiner

*Primary Examiner* — James C Kerveros
(74) *Attorney, Agent, or Firm* — Michael Best & Friedrich LLP

(57) ABSTRACT

To achieve a greater system throughput and be compatible with the legacy HSDPA by support of 64QAM and the higher modulation in the HARQ bit collection, an equipment and a method are disclosed. After applying this method and equipment, the new HSDPA system can perform better in system throughput and can be upgraded smoothly.

13 Claims, 6 Drawing Sheets

| S_1 | S_2 | S_3 | S_4 | S_5 | S_6 | …… | S_480 |
|---|---|---|---|---|---|---|---|
| P2_1 | P1_1 | P2_2 | P1_2 | P2_3 | P1_3 | …… | P1_240 |

FIG. 1

| S_1 | S_3 | S_5 | S_7 | S_9 | S_11 | …… | S_959 |
|---|---|---|---|---|---|---|---|
| S_2 | S_4 | S_6 | S_8 | S_10 | S_12 | …… | S_960 |
| P2_1 | P2_2 | P2_3 | P2_4 | P2_5 | …… | P2_ | P2_480 |
| P1_1 | P1_2 | P1_3 | P1_4 | P1_5 | …… | P1_ | P1_480 |

FIG. 2

| Sys1 | Sys6 | Sys11 | Sys16 | ... | ... | ... | Sys35996 |
|---|---|---|---|---|---|---|---|
| Sys2 | Sys7 | Sys12 | ... | ... | ... | ... | Sys35997 |
| Sys3 | Sys8 | Sys13 | ... | ... | ... | ... | Sys35998 |
| Sys4 | Sys9 | Sys14 | ... | ... | ... | ... | Sys35999 |
| Sys5 | Sys10 | Sys15 | ... | ... | ... | Sys35995 | Sys36000 |
|  |  |  | ... | ... | ... | ... | ... |

FIG. 5

| Sys1 | Sys6 | Sys11 | Sys16 | ... | ... | ... | Sys35996 |
|---|---|---|---|---|---|---|---|
| Sys2 | Sys7 | Sys12 | ... | ... | ... | ... | Sys35997 |
| Sys3 | Sys8 | Sys13 | ... | ... | ... | ... | Sys35998 |
| Sys4 | Sys9 | Sys14 | ... | ... | ... | ... | Sys35999 |
| Sys5 | Sys10 | Sys15 | ... | ... | ... | Sys35995 | Sys36000 |
| P2_1 | P1_1 | P2_2 | P1_2 | ... | ... | P2_3600 | P1_3600 |

FIG. 6

| Sys1 | Sys6 | Sys11 | ... | ... | Sys19376 | ... | Sys32673 |
|---|---|---|---|---|---|---|---|
| Sys2 | Sys7 | Sys12 | ... | ... | Sys19377 | ... | Sys32674 |
| Sys3 | Sys8 | Sys13 | ... | ... | Sys19378 | ... | Sys32675 |
| Sys4 | Sys9 | Sys14 | ... | ... | Sys19379 | ... | Sys32676 |
| Sys5 | Sys10 | Sys15 | ... | Sys19375 | Sys19380 | ... | ... |
|  |  |  | ... | ... | ... | ... | ... |

FIG. 7

| Sys1 | Sys6 | Sys11 | ... | ... | Sys19376 | ... | Sys32673 |
|---|---|---|---|---|---|---|---|
| Sys2 | Sys7 | Sys12 | ... | ... | Sys19377 | ... | Sys32674 |
| Sys3 | Sys8 | Sys13 | ... | ... | Sys19378 | ... | Sys32675 |
| Sys4 | Sys9 | Sys14 | ... | ... | Sys19379 | ... | Sys32676 |
| Sys5 | Sys10 | Sys15 | ... | Sys19375 | Sys19380 | ... | P2_5262 |
| P2_1 | P1_1 | P2_2 | ... | P2_1938 | P1_1938 | ... | P1_5262 |

FIG. 8

EQUIPMENT AND A METHOD FOR BIT COLLECTION IN HYBRID AUTOMATIC REPETITION REQUEST

CROSS-REFERENCE TO RELATED APPLICATIONS

This patent application is a national stage filing under 35 U.S.C. 371 of International Application No. PCT/CN2007/003869, filed 28 Dec. 2007, which claims foreign priority to Chinese Patent Application No. 200710000128.8, filed 5 Jan. 2007, the disclosures of which are incorporated by reference herein in their entireties. Priority to each application is hereby claimed.

TECHNICAL FIELD

The present invention relates to a method for the Hybrid Automatic Repetition reQuest (HARQ) in the Wideband Code Division Multiple Access (WCDMA) wireless communication system, and more specifically, to equipment or an apparatus and a method for bit collection in HARQ in High Speed Packet Access Evolution (HSPA+).

BACKGROUND

According to the RP-060846 (Proposed WID for 64QAM for HSDPA (high rate downlink packet access)) of the $3^{rd}$ Generation Partnership Project (3GPP), HSPA+ will add a new high order modulation such as 64 Quadrature Amplitude Modulation (64QAM). However, the present 3GPP has not defined how to add 64QAM into the new specification.

According to the section 4.5.4.4 in the 3GPP TS 25.212 V7.7.0, the physical layer HARQ module of the base station (Node B) should perform bit collection for the data after the second rate matching in the HARQ. However, the present bit collection module only supports Quadrature Phase Shift Keying modulation (QPSK) and 16QAM. FIG. 1 and FIG. 2 respectively show some methods for bit collection of QPSK and 16QAM in the prior art.

The physical layer based on 3GPP Release 7 (and later ones) will use high order modulation such as 64QAM (or even 256QAM, 1024QAM or 4096QAM), yet the present 3GPP has not determined how to use 64QAM, that is, its physical layer specification has not be formed yet. In order to make the HSPA+ system completely support 64QAM and still be compatible with the present HSDPA, a method and apparatus for bit collection in HARQ is disclosed.

SUMMARY OF THE INVENTION

The technical problem to be solved by the present invention is to offer an apparatus and method for bit collection in the HARQ to make the HSPA+ system better support high order modulation such as 64QAM and be compatible with the present system.

In order to solve the above technical problem, the present invention offers a method for bit collection in HARQ, which includes the following steps:

(a) determining the number of rows $N_{row}$ and the number of columns $N_{col}$ in the rectangular interleaver according to the reading high layer control information and the local configuration parameters;

(b) determining the temporary number of rows $N_r$ and the temporary number of columns $N_c$ according to the number of system bits $N_{t,sys}$ and the number of the columns $N_{col}$ in the interleaver obtained after the second rate matching of the HARQ;

(c) writing the system bits column by column into the interleaver according to the obtained $N_{row}$, $N_{col}$, $N_{t,sys}$, $N_r$ and $N_c$, and then writing the parity bits column by column into the rest row of each column in the rectangular interleaver;

(d) reading the data from the rectangular interleaver in an order different from the writing order to complete the bit collection.

Furthermore, the above method may have the following feature: in step (a), the number of rows in the rectangular interleaver is:

$$N_{row} = BitPerSymbol = \log_2(\text{ModulationOrder});$$

wherein, BitPerSymbol is the number of bits in each symbol, ModulationOrder is the order of the modulation, and the order is 4 when the modulation is QPSK; 16 when 16QAM; 256 when 256QAM; 1024 when 1024QAM; and 4096 when 4096QAM;

The number of columns in the interleaver is:

$$N_{col} = \frac{N_{data}}{N_{row}}.$$

Where $N_{data}$ is the total number of bits after the second rate matching of HARQ (including system bits, parity bits 1 and parity bit 2):

$$N_{data} = \frac{ChipRate}{SF} \cdot TTI \cdot BitPerSymbol \cdot Codes$$

wherein ChipRate is the chip rate of the Wideband Code Division Multiple Access (WCDMA) Frequency Division Duplexing (FDD) system; SF is the spread factor of the High Speed Downlink Packet Access (HSDPA); TTI is the transmission time interval of the HSDPA; Codes is the number of codes allocated to the HSDPA user, in a range of 1~15.

Furthermore, the above method may have the following feature: when using 64QAM, $N_{row}=6$.

Furthermore, the above method may have the following feature: in step (b), the temporary number of rows is:

$$N_r = \text{floor}\left(\frac{N_{t,sys}}{N_{col}}\right),$$

and said temporary number of columns is: $N_c = N_{t,sys} - N_r \cdot N_{col}$;

wherein floor( ) is an operation to get the nearest integer which is not greater than the operand.

Furthermore, the method above may have the following feature: in step (c), the system bits are written according to the following order:

If the temporary number of columns $N_c=0$ and the temporary number of rows $N_r>0$, the system bits are orderly written in row by row from the $1^{st}$ row to the $N_r^{th}$ row in each column and column by column from the $1^{st}$ column to the $N_{col}^{th}$ column;

If the temporary number of columns $N_c \neq 0$ and the temporary number of rows $N_r>0$, the system bits are orderly written in row by row from the $1^{st}$ row to the $(N_r+1)^{th}$ row in each column and column by column from the $1^{st}$ column to the $N_c^{th}$ column, and then the system bits is orderly written row by row from the $1^{st}$ row to the $N_r^{th}$ row in each column and column by column from the $(N_c+1)^{th}$ column to the $N_{col}^{th}$ column;

If the temporary number of columns $N_c \ne 0$ and the temporary number of rows $N_r=0$, the system bits are orderly written in column by column from the $1^{st}$ column to the $N_c^{th}$ column, and there is only one row in each column.

Furthermore, the method above may have the following feature: in step (c), the parity bits are written according to the following order: writing starts from the rest column with the minimal index number, and the first parity bits and the second parity bits are alternatively written, and for each time, the second parity bits are firstly written, and then the first parity bits.

Furthermore, the above method may have the following feature: in step (d), the data are read out row by row from the rectangular interleaver, that is, the data are read out column by column from the first column to the last column in each row and row by row from the $1^{st}$ row to the $N_{row}^{th}$ row, or in the inversed order from the $N_{row}^{th}$ row to the $1^{st}$ row;

Or, in said step (d) the data is read out diagonally from said rectangular interleaver;

Or, in said step (d) the data is read out opposite diagonally from said rectangular interleaver.

In order to solve the above technical problem, the present invention also offers an apparatus for bit collection in the HARQ, comprising a module for reading high layer control information, a module for reading rate matching control information, a module for reading rate matching data, a module for calculating the first interleaving dimension (i.e., Number of Column and Number of Row), a module for calculating the second interleaving dimension, a module for writing bit collection and a module for reading bit collection, where:

the module for reading high layer control information is used to read the control information including the modulation scheme and the number of codes from the high layer, and send the information to the module for calculating the first interleaving dimension;

the module for reading rate matching control information used to read out the number of system bits $N_{t,sys}$ after the second rate matching of the HARQ and send it to the module for calculating the second interleaving dimension;

the module for reading rate matching data is used to read out the system bits and the parity bits needed to be interleaved after the second rate matching of the HARQ, and output the data to be collected to the module for writing bit collection;

the module for calculating the first interleaving dimension is used to calculate the number of the rows $N_{row}$ and the number of the columns $N_{col}$ in the interleaver according to the read high layer control information and the local configuration parameters, and send them to the module for calculating the second interleaving dimension and the module for writing bit collection;

the module for calculating the second interleaving dimension is used to calculate the temporary number of rows $N_r$ and the temporary number of columns $N_c$ according to the number of system bits $N_{t,sys}$ and the number of columns $N_{col}$ in the interleaver obtained after the second rate matching of the HARQ, and send them to the module for writing bit collection;

the module for writing bit collection is used to write the input system bits into the interleaver column by column according to the input parameters $N_{row}$, $N_{col}$, $N_{t,sys}$, $N_r$ and $N_c$, and then write the parity bits into the rest row of each column in the rectangular interleaver column by column;

the module for reading bit collection is used to read out the data from the $N_{row} \times N_{col}$ rectangular interleaver in an order different from the writing order.

Furthermore, the above apparatus may have the following feature: the module for calculating the first interleaving dimension calculates the number of rows and the number of columns in the rectangular interleaver according to the following equations:

The number of the rows in the interleaver is:

$$N_{row} = BitPerSymbol = \log_2(ModulationOrder);$$

wherein, BitPerSymbol is the number of bits of each symbol, ModulationOrder is the order of modulation, the order is 4 when the modulation is QPSK; 16 when 16QAM; 256 when 256QAM; 1024 when 1024QAM; and 4096 when 4096QAM.

The number of columns in the interleaver is:

$$N_{col} = \frac{N_{data}}{N_{row}}.$$

wherein $N_{data}$ is the total number of bits after the second rate matching of the HARQ (including system bits, parity bits 1 and parity bit 2):

$$N_{data} = \frac{ChipRate}{SF} \cdot TTI \cdot BitPerSymbol \cdot Codes$$

wherein ChipRate is the chip rate of the WCDMA FDD system; SF is the spread factor of the HSDPA; TTI is the transmission time interval of the HSDPA; Codes is the number of codes allocated to the HSDPA user, in a range of 1~15.

Furthermore, the apparatus above may have the following feature: when using 64QAM, $N_{row}=6$.

Furthermore, the above apparatus may have the following feature: the module for calculating the second interleaving dimension calculates the temporary number of columns and the temporary number of rows according to the following equations:

the temporary number of rows is:

$$N_r = \text{floor}\left(\frac{N_{t,sys}}{N_{col}}\right),$$

and said temporary number of columns is:

$$N_c = N_{t,sys} - N_r \cdot N_{col};$$

wherein floor( ) is an operation to get the nearest integer which is not greater than the operand.

Furthermore, the above apparatus may have the following feature: the system bits are written into the rectangular interleaver by the module for writing bit collection according to the following order:

If the temporary number of columns $N_c=0$ and the temporary number of rows $N_r>0$, the system bits are orderly written row by row from the $1^{st}$ row to the $N_r^{th}$ row in each column and column by column from the $1^{st}$ column to the $N_{col}^{th}$ column;

If the temporary number of columns $N_c \ne 0$ and the temporary number of rows $N_r>0$, the system bits are orderly written row by row from the $1^{st}$ row to the $N_r+1^{th}$ row in each column and column by column from the $1^{st}$ column to the $N_c^{th}$ column, and then the system bits is orderly written row by row from the $1^{st}$ row to the $N_r^{th}$ row in each column and column by column from the $(N_c+1)^{th}$ column to the $N_{col}^{th}$ column;

If the temporary number of columns $N_c \neq 0$ and the temporary number of rows $N_r = 0$, the system bits are orderly written column by column from the $1^{st}$ column to the $N_c^{th}$ column, and there is only one row in each column.

Furthermore, the above apparatus may have the following feature: the parity bits are written into said rectangular interleaver by the module for writing bit collection according to the following order: writing starts from the rest column with the minimal index number, and the first parity bits and the second parity bits are alternatively written, and for each time, the second parity bits are written first, and then the first parity bits.

Furthermore, the apparatus above may have the following feature: the module for writing bit collection reads out the data row by row from the rectangular interleaver, that is, the data are read out column by column from the first column to the last column in each row and row by row from the $1^{st}$ row to the $N_{row}^{th}$ row, or in the inversed order from the $N_{row}^{th}$ row to the $1^{st}$ row;

Or, in said step (d) the data is read out diagonally from said rectangular interleaver;

Or, in said step (d) the data is read out opposite diagonally from said rectangular interleaver.

After applying the present invention, the HSPA+ system can obtain a greater system throughout than the legacy HSDPA system and, the legacy HSDPA can be smoothly upgraded.

BRIEF DESCRIPTION OF DRAWINGS

FIG. 1 is a diagram of bit collection in the HARQ in the prior art when the number of system bits is 480 after the second rate matching of HARQ, there is one code and the modulation is QPSK;

FIG. 2 is a diagram of bit collection in the HARQ in the prior art when the number of system bits is 960 after the second rate matching of HARQ, there is one code and the modulation is 16QAM;

FIG. 5 is a diagram of writing order of the system bits in accordance with the present invention when the number of system bits is 36000 after the second rate matching of the HARQ, there are 15 codes, and the modulation is 64QAM;

FIG. 6 is a diagram of writing order of the parity bits after writing the system bits in accordance with the present invention when the number of system bits is 36000 after the second rate matching of HARQ, there are 15 codes and the modulation is 64QAM;

FIG. 7 is a diagram of writing order of the system bits in accordance with the present invention when the number of system bits is 32676 after the second rate matching HARQ, there are 15 codes and the modulation is 64QAM;

FIG. 8 is a diagram of writing order of the parity bits after writing the system bits in accordance with the present invention when the system bits is 32676 after the second rate matching of HARQ, there are 15 codes and the modulation is 64QAM;

PREFERRED EMBODIMENTS OF THE PRESENT INVENTION

In order to make the above and other objectives, features and advantages of the present invention more evident, in the following, the present invention will be described in further detail with the preferred embodiments of the present invention in combination with the accompanying figures.

Figure 3:
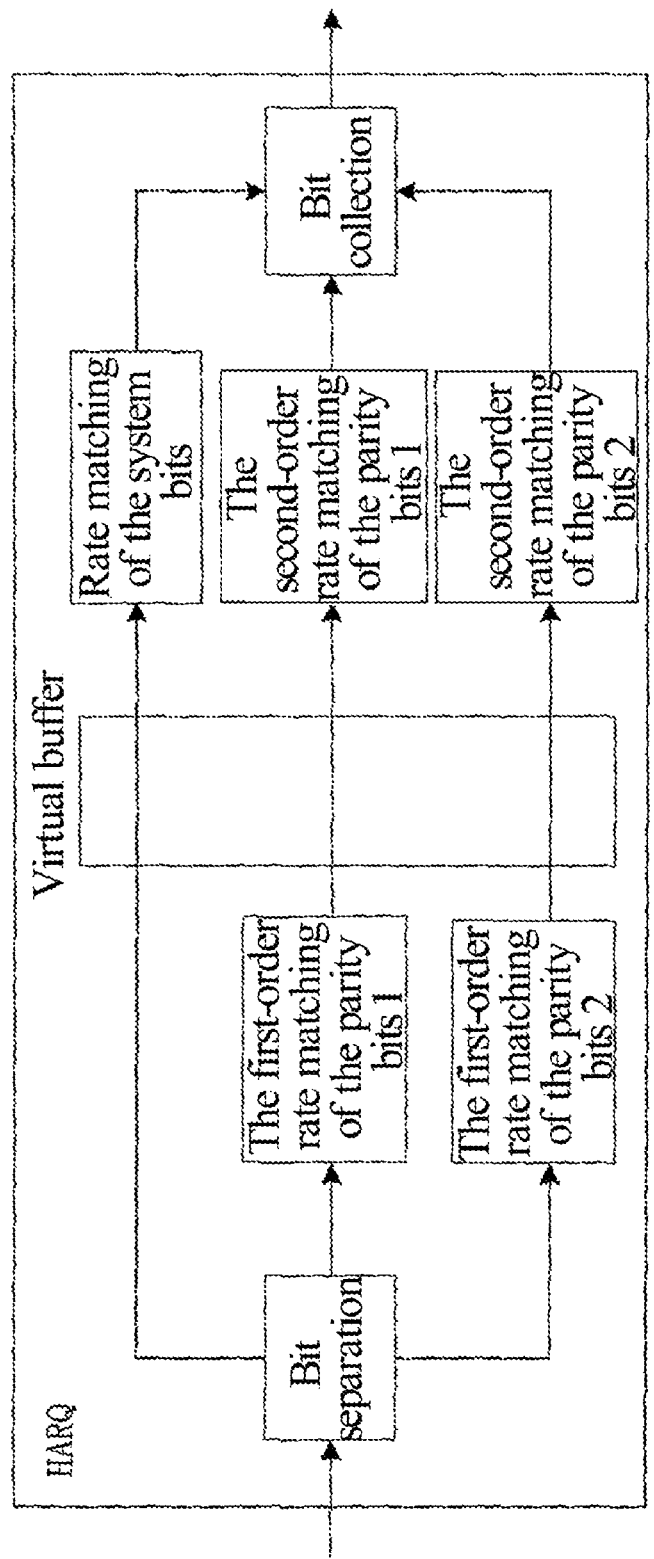
FIG. 3 is the position of the apparatus and method described in the embodiment of the present invention in the HARQ.
Figure 4:
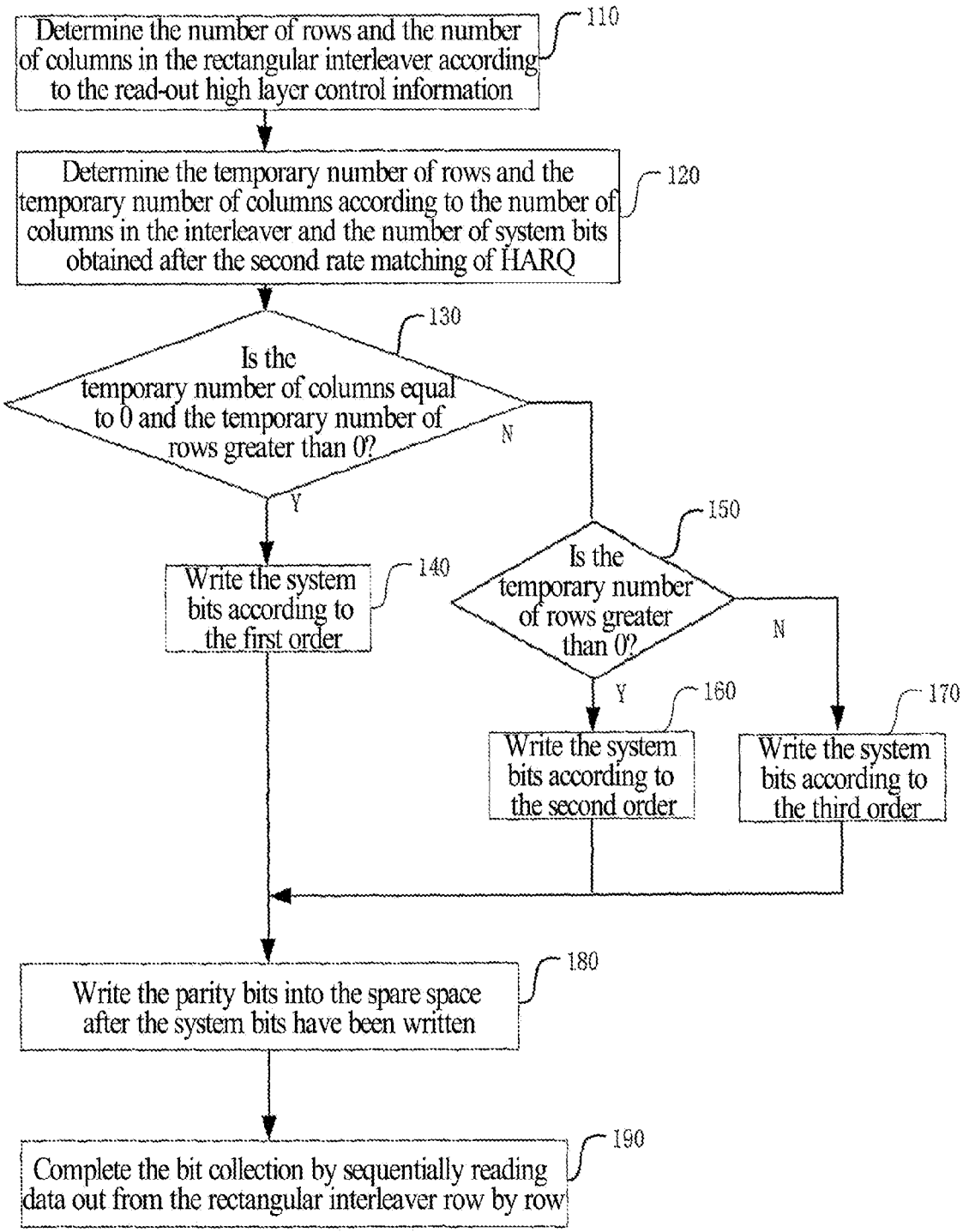
FIG. 4 is a flow chart of the method in accordance with an embodiment of the present invention.

FIG. 3 shows the position of the apparatus and the method for bit collection in the HARQ in accordance with the present invention. The main process for HARQ is: separate the bits firstly, that is, the system bits, parity bits 1 and parity bits 2 mixed after Turbo encoding are separated into 3 paths, wherein the first path is the system bits which are a copy of the original input bits plus 4 tail bits, the second path is the first parity bits (or parity bits 1) which are the convolution codes of the original input bits, and the third path is the second parity bits (or parity bits 2) which are the bits obtained by convoluting the interleaved original input bits. The two paths of parity bits are designed to improve the encoding reliability.

Secondly, after separating the bits, the first rate matching of the parity bits 1 and parity bits 2 is performed to make the system bits pass through directly. And then, the second rate matching is performed. Finally, bit collection is performed to combine the 3 paths into one. The main role of bit collection is to perform a simple bit interleaving: write into column by column and read out row by row. And the main purpose is that if there are continuous errors in the transmission, it can change the continuous errors to separate distributed errors to decrease the total error probability, thus improving the system performance.

The method of bit collection of the HARQ in the HSPA+ system in accordance with the embodiment is shown in FIG. 5, which comprises the following steps:

Step 110: The number of rows $N_{row}$ and the number of columns $N_{col}$ in the rectangular interleaver are determined according to the read high layer control information (modulation scheme and the number of codes) and the local configuration parameters;

The method of calculation is shown as Eqn.1, Eqn.2 and Eqn.3:

The number of rows in the interleaver:

$$N_{row} = \text{BitPerSymbol} = \log_2(\text{ModulationOrder}) \qquad \text{(Eqn.1)}$$

Where, the number of bits per symbol BitPerSymbol and the order of modulation ModulationOrder are shown in Table 1.

TABLE 1

The relationship between the number of bits per symbol, the order of modulation and the method of modulation

| Method of modulation | BitPerSymbol | ModulationOrder |
|---|---|---|
| QPSK | 2 | 4 |
| 16QAM | 4 | 16 |
| 64QAM | 6 | 64 |
| 256QAM | 8 | 256 |
| 1024QAM | 10 | 1024 |
| 4096QAM | 12 | 4096 |

The number of columns in the interleaver is:

$$N_{col} = \frac{N_{data}}{N_{row}} \qquad \text{(Eqn. 2)}$$

wherein $N_{data}$ is the total number of bits obtained after the second rate matching of HARQ (including system bits, parity bits 1 and parity bit 2).

$$N_{data} = \frac{\text{ChipRate}}{SF} \cdot TTI \cdot \text{BitPerSymbol} \cdot \text{Codes} \qquad \text{(Eqn. 3)}$$

wherein

ChipRate (fixed to 3.84 Mcps) is chip rate the of the WCDMA Frequency Division Duplex (FDD) system;

SF (fixed to 16) is the spread factor of the HSDPA;

TTI (fixed to 3 intervals, that is, 2 ms) is the transmission time interval of the HSDPA;

BitPerSymbol has the same meaning as Eqn.1;

Codes (from 1 to 15) is the number of codes distributed to HSDPA.

Meanwhile, the present invention is illustrated with two application examples:

In the first application example, suppose the method of modulation reading out from the high layer is 64QAM, the number of codes is 15, the number of system bits after the second rate matching of HARQ is 36000, then from Eqn.1~Eqn.3, it can be calculated that the number of rows $N_{row}$ of the rectangular interleaver is 6, and the number of columns $N_{col}$ of the rectangular interleaver is 7200.

The values of the above parameters of the second application example are the same as that of the first application example.

Step 120: the temporary number of rows $N_r$ and the temporary number of columns $N_c$ are determined according to the number of columns $N_{col}$ of the interleaver and the number of system bits $N_{t,sys}$ after the second rate matching of the HARQ;

The method of calculation is shown as Eqn.4 and Eqn.5.

The temporary number of rows is:

$$N_r = \text{floor}\left(\frac{N_{t,sys}}{N_{col}}\right) \quad \text{(Eqn. 4)}$$

wherein floor( ) is an operation to get the nearest integer which is not greater than the operand;

The temporary number of columns is:

$$N_c = N_{t,sys} - N_r \cdot N_{col} \quad \text{(Eqn.5)}$$

In the first application example, suppose $N_{t,sys}=36000$, then from Eqn.4 and Eqn.5, it can be calculated that $N_r=5$ and $N_c=0$.

In the second application example, suppose $N_{t,sys}=32676$, then from Eqn.4 and Eqn.5, it can be calculated that $N_r=4$ and $N_c=3876$.

Step 130: Determine whether the condition that the temporary number of columns $N_c$ equals to 0 and the temporary number of rows $N_r>0$ can be met or not, if yes, then proceed to step 140, otherwise, proceed to step 150;

Step 140: The system bits are written according to the first order, that is the system bits are orderly written row by row from the $1^{st}$ row to the $N_r^{th}$ row in each column and column by column from the $1^{st}$ column to the $N_{col}^{th}$ column, and after that, proceed to step 180;

Since in the first application example, $N_r=5$ and $N_c=0$, the system bits are orderly written row by row from the $1^{st}$ row to the $5^{th}$ row in each column and column by column from the $1^{st}$ column to the $7200^{th}$ column, as shown in FIG. 5.

Step 150, determine whether the condition $N_r>0$ can be met or not, if yes, then proceed to step 160, otherwise, proceed to step 170;

Step 160, now the temporary number of columns $N_c \neq 0$ and the temporary number of rows $N_r>0$, the system bits are written according to the second method, that is, the system bits are orderly written row by row from the $1^{st}$ row to the $N_r+1^{th}$ row in each column and column by column from the $1^{st}$ column to the $N_c^{th}$ column, and then the system bits are orderly written row by row from the $1^{st}$ row to the $N_r^{th}$ row in each column and column by column from the $N_c+1^{th}$ column to the $N_{col}^{th}$ column, after that, proceed to step 180;

Since in the second application example, $N_r=4$ and $N_c=3876$, the system bits are written row by row from the $1^{st}$ row to the $5^{th}$ row in each column and column by column from the $1^{st}$ column to the $3876^{th}$ column, and then, orderly written row by row from the $1^{st}$ row to the $4^{th}$ row in each column of the remaining $7200-3876=3324$ columns from the $3877^{th}$ column, as shown in FIG. 7.

Step 170, now the temporary number of columns $N_c \neq 0$ and that of rows $N_r>0$, the system bits are written into according to the third order, that is, the system bits are orderly written into from the $1^{st}$ column to the $N_c^{th}$ column, and there is only one row in each column, after that, proceed to step 180;

From the above steps, it can be seen that the system bits are written into column by column (the third order is a special case of writing into column by column).

Step 180: The parity bits are written into the remaining space after the system bits are written;

Starting from the rest column with the minimal index number, the parity bits are written into the rest rows of each column in the rectangular interleaver column by column, and the first parity bits and the second parity bits are alternatively written, first the second parity bits, and then the first parity bits, and then the second parity bits again, and so on. After the parity bits are written, all columns and rows in the rectangular interleaver are filled exactly.

The order of writing the parity bits in the first application example is shown as FIG. 6, and the order of writing the parity bits in the second application example is shown as FIG. 8.

Step 190: read out the data row by row from the $N_{row} \times N_{col}$ rectangular interleaver to complete the bit collection.

For the QPSK data, data in the first row are read out starting from the first column of the first row, and then data in the second row are read out starting from the first column of the second row. For 16QAM data, data in the first row are read out starting from the first column of the first row, data in the second row are read out starting from the first column of the second row, and data in the third row are read out starting from the first column of the third row, and finally, data in the fourth row are read out starting from the first column of the fourth row.

For 64QAM, 256QAM, 1024QAM and 4096QAM, similar to the 16QAM, the data can be orderly read out column by column from the first column to the last column in each row and row by row from the $1^{st}$ row to the $N_{row}^{th}$ row, or in an inversed order, from the $N_{row}^{th}$ row to the $1^{st}$ row. It can also be read out in other orders, such as: diagonally or opposite diagonally.

In the first application example, the data are read out from the 6×7200 rectangular interleaver orderly (in natural order), that is, the data are read out orderly from the $1^{st}$ row to the $6^{th}$ row: Sys1, Sys6, Sys11, Sys16 . . . , Sys35996; Sys2, Sys7, Sys12, . . . . . . . . . , Sys35997; . . . ; Sys5, Sys10, Sys15, . . . . . . . . . , Sys35995, Sys36000; P2__1, P1__1, P2__2, P1__2, . . . . . . , P2__3600, P1__3600.

In the second application example, the data are read out from the 6×7200 rectangular interleaver reversely-orderly (in reverse order), that is, the data are read orderly from the $6^{th}$ row to the $1^{st}$ row:

P2__1, P1__1, P2__2, P1__2, . . . . . . , P2__1938, . . . P1__1938, . . . P1__5262;

Sys5, Sys10, Sys15, . . . , Sys19375, Sys19380, . . . , P2__5262;

Sys4, Sys9, Sys14, . . . , Sys19379, . . . , Sys__32676;

Sys3, Sys8, Sys13, . . . , Sys19378, . . . , Sys__32675;

Sys2, Sys7, Sys12, . . . , Sys19377, . . . , Sys__32674;

Sys1, Sys6, Sys11, . . . , Sys19376, . . . , Sys__32673.

The method above of the present invention also can be used when applying 256QAM, 1024QAM or 4096QAM.

Figure 9:
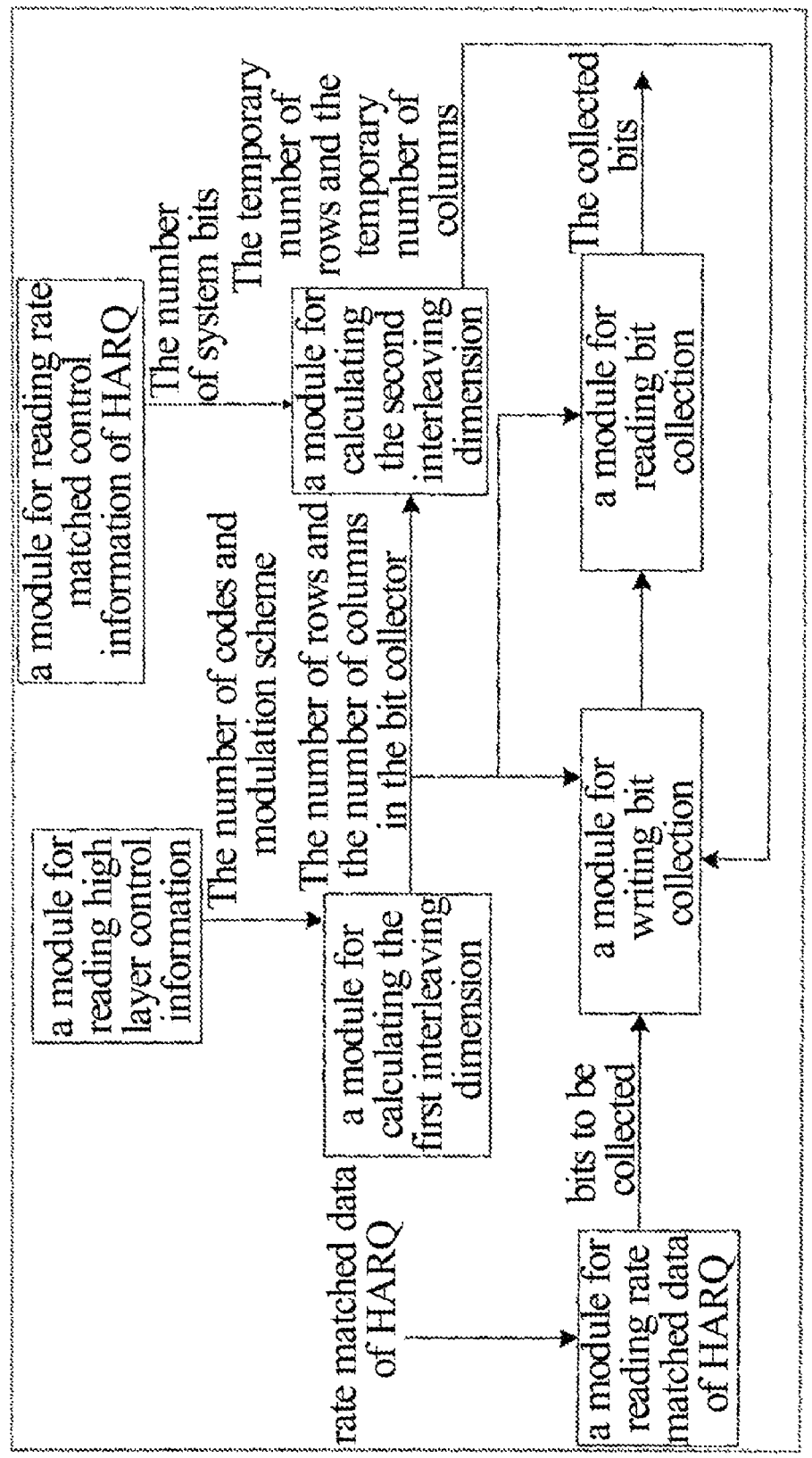
FIG. 9 is a diagram of the modules in the apparatus in accordance with the embodiment of the present invention.

Correspondingly, this embodiment also offers an apparatus to implement the above method, and the apparatus is shown as FIG. 9 and comprises:

a module for reading high layer control information: used to read information, such as the modulation scheme, the number of codes, from the high layer and output the information to a module for calculating the first interleaving dimension.

a module for reading rate matching control information: used to read out the number of system bits $N_{t,sys}$ obtained from the second rate matching of HARQ and output it to a module for calculating the second interleaving dimension. Please refer to FIG. 3, this parameter is read from the rate matching module of the system bits.

a module for reading rate matching data: used to read the system bits and parity bits needed to be interleaved after the second rate matching of the HARQ, and output these data to be collected to a module for writing bit collection. Please refer to FIG. 3, these data are respectively read from the rate matching module of the system bits, the second-order rate matching module of the first parity bits and the second-order rate matching module of the second parity bits.

a module for calculating the first interleaving dimension: used to calculate the number of rows $N_{row}$ and the number of columns $N_{col}$ in the interleaver according to the read high layer control information and the configuration parameters, output these numbers to a module for calculating the second interleaving dimension and a module for writing bit collection. Those parameters, such as the spread factor, having fixed values, can be directly configured in the corresponding module for calculating.

a module for calculating the second interleaving dimension: used to calculate the temporary number of rows $N_r$ and the temporary number of columns $N_c$ in the interleaver according to the number of system bits $N_{t,sys}$ and the number of columns $N_{col}$ in the interleaver obtained after the second rate matching of the HARQ, and output these temporary numbers to the module for writing bit collection.

a module for writing bit collection: used to orderly write the input system bits into the interleaver according to the input parameters $N_{row}$, $N_{col}$, $N_{t,sys}$, $N_r$ and $N_c$, and then write the parity bits into the rest rows of each column in the rectangular interleaver column by column.

a module for reading bit collection: used to read data from the $N_{row} \times N_{col}$ rectangular interleaver by using an order different from the writing order, such as reading row by row.

The specific methods of calculating, writing and reading of each module have been described in the above specification and will be omitted here.

With the above apparatus and method, the Node B can offer a greater system performance on the basis of being completely compatible with the present system.

INDUSTRIAL APPLICABILITY

It can be seen that the method and apparatus of the present invention can make the HSPA+ system better support high order modulation technique such as 64QAM and be completely compatible with the present system, so as to make the HSPA+ system have a greater system throughput than the legacy HSDPA system and, the legacy HSDPA system can be smoothly upgraded.

What we claim is:

1. A method for bit collection in a Hybrid Automatic Repetition reQuest (HARQ), comprising the following steps of:
 (a) determining a number of rows $N_{row}$ and a number of columns $N_{col}$ in a rectangular interleaver according to read high layer control information and local configuration parameters, where the number of rows in the rectangular interleaver is:

$$N_{row} = \text{BitPerSymbol} = \log_2(\text{ModulationOrder})$$

wherein, BitPerSymbol is a number of bits of each symbol, ModulationOrder is an order of modulation, and the order is 4 when the modulation is Quadrature Phase Shift Keying modulation; the order is 16 when the modulation is 16 Quadrature Amplitude Modulation; the order is 256 when the modulation is 256 Quadrature Amplitude Modulation; the order is 1024 when the modulation is 1024 Quadrature Amplitude Modulation; and the order is 4096 when the modulation is 4096 Quadrature Amplitude Modulation;

the number of columns in the interleaver is:

$$N_{col} = \frac{N_{data}}{N_{row}}.$$

wherein $N_{data}$ is the number of total bits after a second rate matching of the HARQ:

$$N_{data} = \frac{\text{ChipRate}}{SF} \cdot TTI \cdot \text{BitPerSymbol} \cdot \text{Codes}$$

wherein ChipRate is a chip rate of WCDMA FDD system; SF is a spread factor of a HSDPA; TTI is a transmission time interval of HSDPA; Codes is a number of codes allocated to HSDPA user, in a range of 1~15;
 (b) determining a temporary number of rows $N_r$ and a temporary number of columns $N_c$ according to a number of the columns $N_{col}$ in the interleaver and a number of system bits $N_{t,sys}$ obtained after the second rate matching of the HARQ;
 (c) writing system bits column by column into the interleaver according to the obtained $N_{row}$, $N_{col}$, $N_{t,sys}$, $N_r$ and $N_c$, and then writing parity bits column by column into blank rows of each column in the rectangular interleaver;
 (d) reading data from the rectangular interleaver in an order different from the writing order to complete the bit collection.

2. The method of claim 1, wherein when using 64 Quadrature Amplitude Modulation, $N_{row}$ is 6.

3. The method of claim 1, wherein
in step (b), the temporary number of rows is:

$$N_r = \text{floor}\left(\frac{N_{t,sys}}{N_{col}}\right),$$

and the temporary number of columns is:

$$N_c = N_{t,sys} - N_r \cdot N_{col};$$

wherein floor( ) is an operation to get the nearest integer which is not greater than the operand.

4. The method of claim 1, wherein, in step (c), the system bits are written according to the following order:
 If the temporary number of columns $N_c$ is 0 and the temporary number of rows $N_r$ is greater than 0, the system bits are orderly written row by row from the $1^{st}$ row to the $N_r^{th}$ row in each column and column by column from the $1^{st}$ column to the $N_{col}^{th}$ column;

If the temporary number of columns $N_c$ is not equal to 0 and the temporary number of rows $N_r$ is greater than 0, the system bits are orderly written row by row from the 1$^{st}$ row to the $(N_r+1)^{th}$ row in each column and column by column from the 1$^{st}$ column to the $N_c^{th}$ column, and then the system bits is orderly written row by row from the 1$^{st}$ row to the $N_r^{th}$ row in each column and column by column from the $(N_c+1)^{th}$ column to the $N_{col}^{th}$ column;

If the temporary number of columns $N_c$ is not equal to 0 and the temporary number of rows $N_r$ is 0, the system bits are orderly written column by column from the 1$^{st}$ column to the $N_c^{th}$ column, and there is only one row in each column.

5. The method of claim 1, wherein in step (c), the parity bits are written into according to the following order: writing starts from the blank column with a minimal index number, and first parity bits and second parity bits are alternatively written, and for each time, the second parity bits are firstly written, and then the first ones.

6. The method of claim 1, wherein, in step (d), the data are read row by row from the rectangular interleaver, that is, the data are read column by column from the first column to the last column in each row and row by row from the 1$^{st}$ row to the $N_{row}^{th}$ row, or in the inversed order from the $N_{row}^{th}$ row to the 1$^{st}$ row;

or, in said step (d) the data is read diagonally from said rectangular interleaver;

or, in said step (d) the data is read out opposite diagonally from said rectangular interleaver.

7. An apparatus for bit collection in a HARQ, comprising a module for reading high layer control information, a module for reading rate matching control information, a module for reading rate matching data, a module for calculating the first interleaving dimension, a module for calculating the second interleaving dimension, a module for writing bit collection and a module for reading bit collection, wherein:

the module for reading high layer control information is used to read control information including modulation scheme and number of codes from high layer, and send the control information to the module for calculating the first interleaving dimension;

the module for reading rate matching control information is used to read number of system bits $N_{t,sys}$ after a second rate matching of the HARQ and send the number of system bits $N_{t,sys}$ to the module for calculating the second interleaving dimension;

the module for reading rate matching data is used to read system bits and parity bits required to be interleaved after the second rate matching of the HARQ, and output the data to be collected to the module for writing bit collection;

the module for calculating the first interleaving dimension is used to calculate a number of rows $N_{row}$ and a number of columns $N_{col}$ in an interleaver according to the read high layer control information and local configuration parameters, and send the $N_{row}$ and the $N_{col}$ to the second module for calculating interleaving dimension and the module for writing bit collection;

the module for calculating the second interleaving dimension is used to calculate a temporary number of rows $N_r$ and a temporary number of columns $N_c$ according to the number of system bits $N_{t,sys}$ and the number of columns $N_{col}$ in the interleaver obtained after the second rate matching of the HARQ, and send the $N_r$ and the $N_c$ to the module for writing bit collection;

the module for writing bit collection is used to write the input system bits into the interleaver column by column according to the input parameters $N_{row}$, $N_{col}$, $N_{t,sys}$, $N_r$ and $N_c$, and then write the parity bits into rest rows of each column in the rectangular interleaver column by column;

the module for reading bit collection is used to read out the data from the $N_{row} \times N_{col}$ rectangular interleaver in an order different from the writing order.

8. The apparatus of claim 7, wherein, the module for calculating the first interleaving dimension calculates the number of rows and the number of columns in the rectangular interleaver according to the following equations:

The number of the rows in the interleaver is:

$$N_{row} = \text{BitPerSymbol} = \log_2(\text{ModulationOrder});$$

wherein, BitPerSymbol is the number of bits of each symbol, ModulationOrder is an order of modulation, the order is 4 when the modulation is Quadrature Phase Shift Keying modulation; the order is 16 when the modulation is 16 Quadrature Amplitude Modulation; the order is 256 when the modulation is 256 Quadrature Amplitude Modulation; the order is 1024 when the modulation is 1024 Quadrature Amplitude Modulation; and the order is 4096 when the modulation is 4096 Quadrature Amplitude Modulation;

the number of columns in the interleaver is:

$$N_{col} = \frac{N_{data}}{N_{row}}.$$

wherein $N_{data}$ is the number of total bits after the second rate matching of hybrid automatic repetition request:

$$N_{data} = \frac{ChipRate}{SF} \cdot TTI \cdot BitPerSymbol \cdot Codes$$

wherein ChipRate is a chip rate of the WCDMA FDD system; SF is a spread factor of HSDPA; TTI is a transmission time interval of HSDPA; Codes is a number of codes allocated to the HSDPA user, in a range of 1~15.

9. The apparatus of claim 8, wherein, when using 64 Quadrature Amplitude Modulation, $N_{row}$ is 6.

10. The apparatus of claim 7, wherein, the module for calculating the second interleaving dimension calculates the temporary number of columns and the temporary number of rows according to the following equations:

the temporary number of rows is:

$$N_r = \text{floor}\left(\frac{N_{t,sys}}{N_{col}}\right),$$

and the temporary number of columns is:

$$N_c = N_{t,sys} - N_r \cdot N_{col};$$

wherein floor( ) is an operation to get the nearest integer which is not greater than the operand.

11. The apparatus of claim 7, wherein,
the system bits are written into the rectangular interleaver by the module for writing bit collection according to the following order:

If the temporary number of columns $N_c$ is 0 and the temporary number of rows $N_r$ is greater than 0, the system bits are orderly written row by row from the $1^{st}$ row to the $N_r^{th}$ row in each column and column by column from the $1^{st}$ column to the $N_{col}^{th}$ column;

If the temporary number of columns $N_c$ is not equal to 0 and the temporary number of rows $N_r$ is greater than 0, the system bits are orderly written row by row from the $1^{st}$ row to the $(N_{r+1})^{th}$ row in each column and column by column from the $1^{st}$ column to the $N_c^{th}$ column, and then the system bits is orderly written row by row from the $1^{st}$ row to the $N_r^{th}$ row in each column and column by column from the $(N_c+1)^{th}$ column to the $N_{col}^{th}$ column;

If the temporary number of columns $N_c$ is not equal to 0 and the temporary number of rows $N_r$ is 0, the system bits are orderly written column by column from the $1^{st}$ column to the $N_c^{th}$ column, and there is only one row in each column.

12. The apparatus of claim 7, wherein,
the parity bits are written into said rectangular interleaver by the module for writing bit collection according to the following order: writing starts from a rest column with a minimal index number, and first parity bits and second parity bits are alternatively written, and for each time, the second parity bits are firstly written, and then the first ones.

13. The apparatus of claim 7, wherein,
the module for reading bit collection reads out the data row by row from the rectangular interleaver, that is, the data are read column by column from the first column to the last column in each row and row by row from the $1^{st}$ row to the $N_{row}^{th}$ row, or in the reverse order from the $N_{row}^{th}$ row to the $1^{st}$ row.

* * * * *